United States Patent
Ho et al.

(10) Patent No.: US 9,407,208 B2
(45) Date of Patent: Aug. 2, 2016

(54) CLASS AB AMPLIFIER WITH PROGRAMMABLE QUIESCENT CURRENT

(71) Applicant: Lattice Semiconductor Corporation, Hillsboro, OR (US)

(72) Inventors: Vinh Ho, Milpitas, CA (US); Carl Chai, San Jose, CA (US); Allan Lin, San Jose, CA (US)

(73) Assignee: LATTICE SEMICONDUCTOR CORPORATION, Portland, OR (US)

(*) Notice: Subject to any disclaimer, the term of this patent is extended or adjusted under 35 U.S.C. 154(b) by 0 days.

(21) Appl. No.: 14/535,454

(22) Filed: Nov. 7, 2014

(65) Prior Publication Data

US 2016/0134238 A1    May 12, 2016

(51) Int. Cl.
*H03F 3/26* (2006.01)
*H03F 1/02* (2006.01)
*H03F 3/21* (2006.01)
*H03F 3/45* (2006.01)

(52) U.S. Cl.
CPC ............... *H03F 1/0205* (2013.01); *H03F 3/21* (2013.01); *H03F 3/26* (2013.01); *H03F 3/45076* (2013.01); *H03F 2200/129* (2013.01); *H03F 2203/45332* (2013.01)

(58) Field of Classification Search
CPC .......................................................... H03F 3/26
USPC .............................................. 330/267, 310, 265
See application file for complete search history.

(56) References Cited

U.S. PATENT DOCUMENTS

| | | | | |
|---|---|---|---|---|
| 4,254,379 A * | 3/1981 | Kawanabe | ............ | H03F 3/3071 330/264 |
| 4,274,059 A * | 6/1981 | Okabe | .................... | H03F 1/3217 330/266 |
| 4,415,865 A | 11/1983 | Gustafsson | | |
| 5,854,573 A | 12/1998 | Chan | | |
| 7,265,602 B2 * | 9/2007 | Utsuno | ................ | G09G 3/3688 327/407 |
| 7,652,531 B2 * | 1/2010 | Wang | ........................ | H03F 1/08 330/100 |
| 7,920,026 B2 | 4/2011 | Hughes | | |
| 2014/0077879 A1 * | 3/2014 | Naeini | .................... | H03F 1/086 330/255 |

* cited by examiner

*Primary Examiner* — Patricia T Nguyen

(57) ABSTRACT

A Class AB amplifier has a control stage and a push-pull stage. The control stage has a programmable resistor that allows a floating constant voltage to applied to the push-pull stage such that the quiescent current of the amplifier is relatively low. The configuration enables the amplifier to operate properly at relatively low power-supply voltage levels. The amplifier can be configured as the output driver for an operational amplifier (op-amp) with a Miller compensation configuration that replaces the conventional Miller compensation resistor with a transistor that is part of the op-amp.

16 Claims, 3 Drawing Sheets

100

200

400

500

CLASS AB AMPLIFIER WITH PROGRAMMABLE QUIESCENT CURRENT

BACKGROUND

1. Field of the Invention

The present invention relates to electronics and, more specifically, to Class AB amplifiers.

2. Description of the Related Art

This section introduces aspects that may help facilitate a better understanding of the invention. Accordingly, the statements of this section are to be read in this light and are not to be understood as admissions about what is prior art or what is not prior art.

Class AB amplifiers offer a tradeoff between the linearity of Class A amplifiers and the power efficiency of Class B amplifiers. Class AB amplifiers are widely used as an output stage to provide a sufficiently linear rail-to-rail output signal with good power efficiency.

FIG. 1 shows a schematic circuit diagram of a conventional Class AB amplifier 100 that receives an input voltage signal $V_{IN}$ and generates an amplified output voltage signal $V_{OUT}$ to drive a load current $i_L$ across a load resistor $R_L$. In amplifier 100, transistors M1 and M2 are in a complementary source-follower configuration, where M1 is a p-type (e.g., PMOS) source-follower, and M2 is an n-type (e.g., NMOS) source-follower. This complementary source-follower configuration needs a supply voltage Vdd of at least 2*Vgs+2*Vdsat to operate properly, where Vgs is the gate-to-source voltage and Vdsat is the difference between Vgs and the threshold voltage Vth for the transistor devices used to implement amplifier 100. As such, amplifier 100 is not suitable for low-voltage supply scenarios. Furthermore, it has relatively high power consumption.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Figure 1:
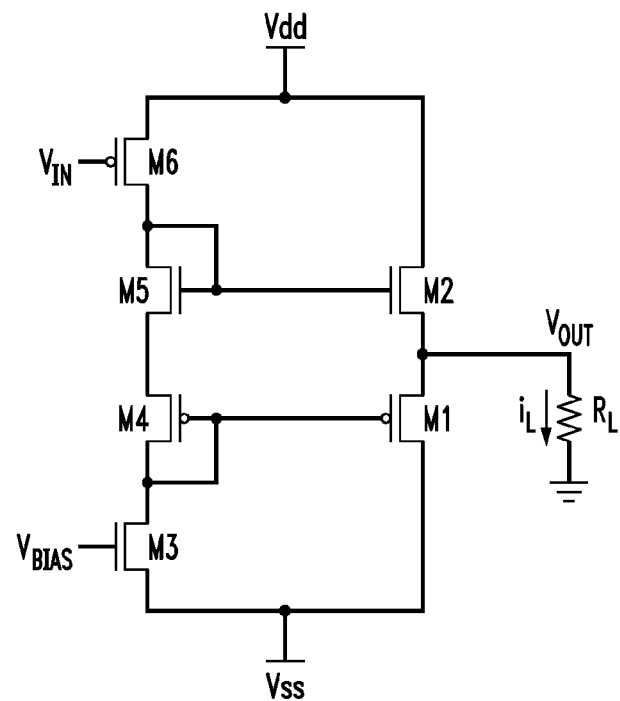
FIG. 1 shows a schematic circuit diagram of a conventional Class AB amplifier.
Figure 2:
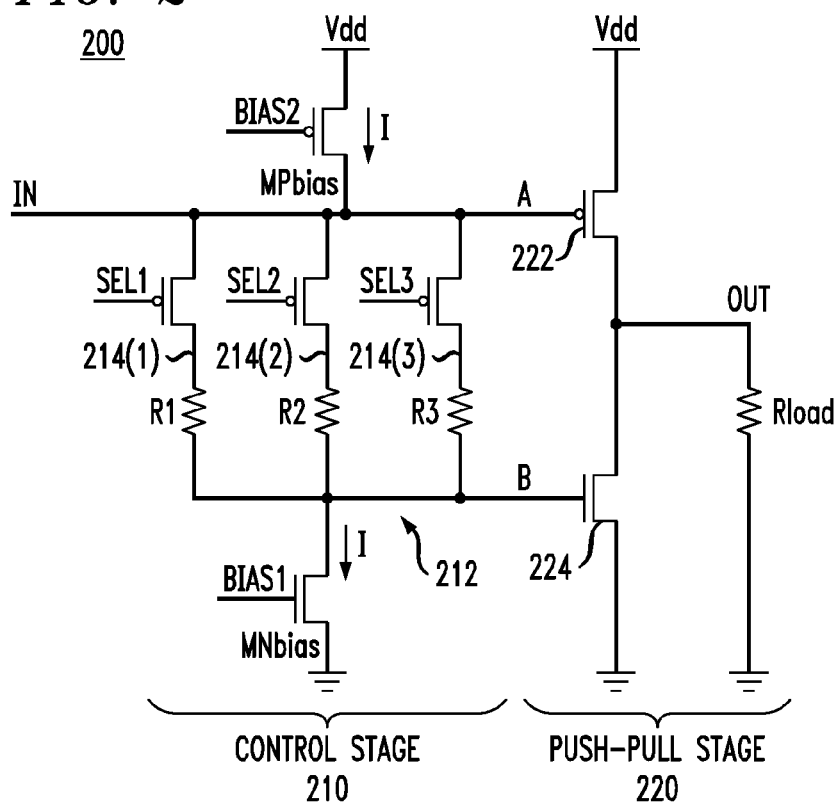
FIG. 2 shows a schematic circuit diagram of an exemplary Class AB amplifier of the present disclosure.

FIG. 2 shows a schematic circuit diagram of an exemplary Class AB amplifier 200 of the present disclosure. Class AB amplifier 200 has two stages: a control stage 210 and a push-pull stage 220.

Control stage 210 comprises a programmable resistor 212 consisting of three independently programmable resistor legs 214(1)-214(3) connected in parallel and sandwiched between two constant-current transistor devices: PMOS current-source device MPbias and NMOS current-sink device MNbias. Each programmable resistor leg 214(i) has a resistor Ri connected in series with a switch device SELi. Switch devices SEL1-SEL3 can be selectively turned on or off to provide different effective levels of resistance connected between MPbias and MNbias. Programmable resistor 212 is used to control quiescent current I through devices MPbias and MNbias in amplifier 200.

Push-pull stage 220 comprises a PMOS device 222 and an NMOS device 224.

Control stage 210 uses resistors R1-R3 and constant-current devices MPbias and MNbias to apply a floating constant-voltage source VAB between the gates of PMOS device 222 and NMOS device 224 equal to the product of (i) the current level I through devices MPbias and MNbias and (ii) the effective resistance Reff of programmable resistor 212.

The voltage at node IN can have a dc component Vin(dc) and an ac component Vin(ac). When the ac component Vin(ac) is negative, the voltage at node IN will be below the dc component Vin(dc). When the ac component Vin(ac) is positive, the voltage at node IN will be above the dc component Vin(dc).

When the ac component Vin(ac) is zero, amplifier 200 is at its dc operation point. Programmable resistor 212 is configured such that devices 222 and 224 are both near cutoff, so that, when Vin(ac) is zero, only a small amount of current (referred to as the quiescent current) is conducted in push-pull stage 220, and the output ac current flowing through load resistor Rload is zero.

When the ac component Vin(ac) is negative, then the voltage at node IN is below the dc operation point of amplifier 200, and the net voltages at nodes A and B (which voltages are referred to as Net A and Net B, respectively) decrease from their dc values. Net A decreases to let PMOS device 222 conduct more current (i.e., become more open), and Net B decreases to let NMOS device 224 conduct less current (i.e., become more closed), making the output of push-pull stage 220 sink current.

When the ac component Vin(ac) is positive, then the voltage at node IN is above the dc operation point of amplifier 200, and both Net A and Net B increase from their dc values. Net A increases to let PMOS device 222 conduct less current (i.e., become more closed), and Net B increases to let NMOS device 224 conduct more current (i.e., become more open), making the output of push-pull stage 220 source current.

The resistor control scheme of FIG. 2 makes amplifier 200 suitable for relatively low-voltage supplies, e.g., Vdd=VAB+2*Vdsat rather than 2*Vgs+2*Vdsat as in amplifier 100. Resistor control is direct and consumes low-voltage headroom. This results in much lower power consumption. Providing the ability to program the quiescent current to a suitable level avoids degrading the bandwidth of the amplifier. A higher quiescent current enables devices 222 and 224 to switch states faster in response to changes in Vin and provides better linearity, but at a cost of higher power for amplifier 200. A lower quiescent current reduces power for the amplifier, but at a cost of a slower response by devices 222 and 224 to changes in Vin and worse linearity.

Although programmable resistor 212 of amplifier 200 has been described as having three programmable resistor legs 214 connected parallel, those skilled in the art will understand that any suitable programmable resistor may be used in alternative embodiments, including (without limitation) programmable resistors having fewer than or more than three parallel legs. Although FIG. 2 is a single-ended amplifier, those skilled in the art will understand that the present invention can also be implemented in the context of differential amplifiers.

Figure 3:
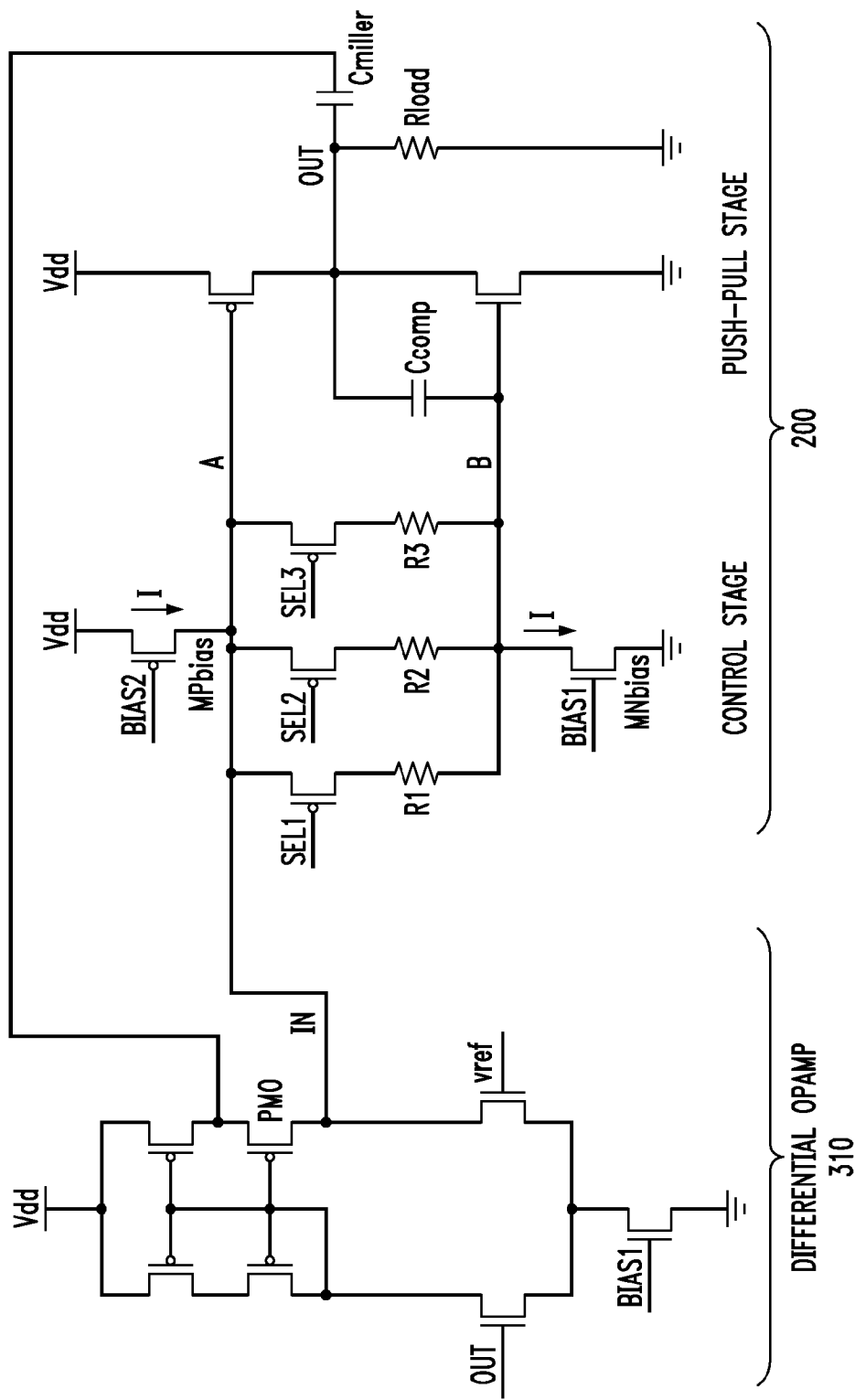
FIG. 3 shows a op-amp circuit in which the Class AB amplifier of FIG. 2 forms the output driver for a differential operational amplifier (op-amp) used as unit-gain voltage follower.

FIG. 3 shows a op-amp circuit 300 in which Class AB amplifier 200 of FIG. 2 forms the output driver for an operational amplifier (op-amp) 310 used as unit-gain voltage follower. Op-amp 310 is a differential input, single-ended output op-amp. The output of op-amp 310 is net IN, which also is the input to Class AB amplifier 200. In FIG. 3, one input of op-amp 310 is vref. The other input of op-amp 310 is net OUT, which is the output of Class AB amplifier 200. Net OUT may be used as a power supply voltage, as indicated by its application to Rload. Class AB amplifier 200 and op-amp 310 form a negative feedback, unit gain, voltage follower. This is just one application of Class AB amplifier 200 as the output stage in op-amp circuit 300.

In addition to the control stage/push-pull stage architecture of FIG. 2, op-amp circuit 300 includes a Miller compensation scheme comprising a compensation feedback path from the output node OUT to the source of PMOS device PM0 of op-amp 310 via compensation capacitor Cmiller. The Miller compensation scheme of FIG. 3 employs device PM0 as the current-mirror loading device of op-amp 310, instead of a resistor, as in a conventional Miller compensation scheme. By connecting the compensation capacitor Cmiller to an internal, low-impedance node (i.e., the source of PM0), no AC current feedback is allowed from the output node OUT to the internal high-impedance input node IN. This results in pole splitting being achieved with a lower capacitance value of the compensation capacitor Cmiller, which results in Class AB amplifier 200 having a much larger unity-gain frequency, while consuming less power and having a smaller layout compared to other Miller compensated op-amps. Op-amp 300 thus functions as a voltage regulator with a Class AB output stage providing an output voltage OUT, in which indirect Miller compensation is applied for reduced capacitance and higher speed.

Figure 4:
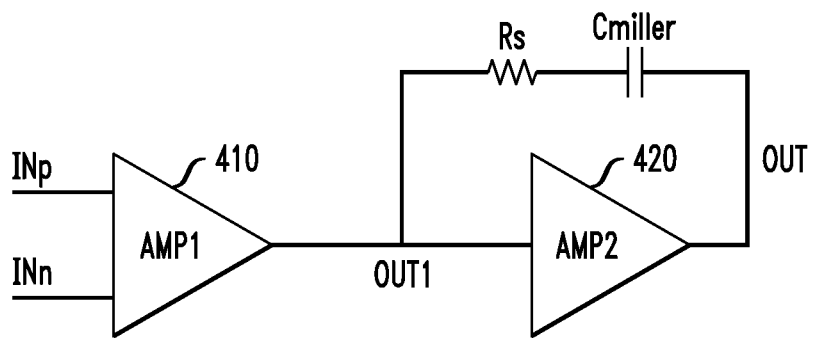
FIG. 4 shows a schematic block diagram of a circuit employing a conventional Miller compensation scheme for two-stage amplifiers.

FIG. 4 shows a schematic block diagram of a circuit 400 employing a conventional Miller compensation scheme for two-stage amplifiers 410 and 420. In this conventional configuration, Miller compensation is achieved by connecting the output of the second amplifier 420 to the output of the first amplifier through a feedback path consisting of a compensation capacitor Cmiller connected in series with a resistor Rs.

Figure 5:
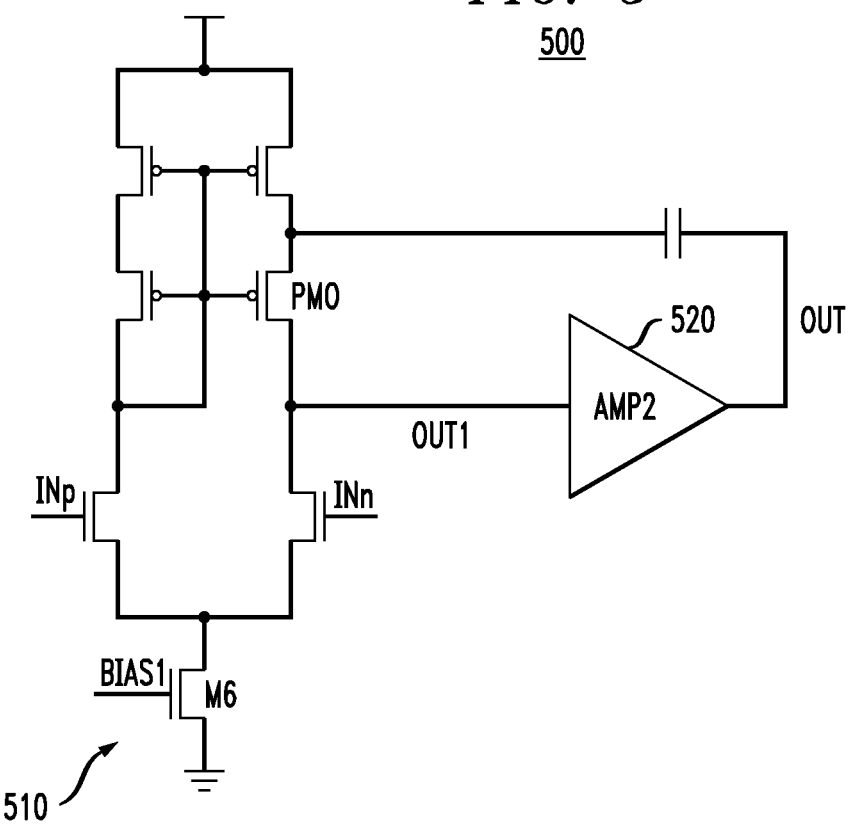
FIG. 5 shows a schematic block diagram of a circuit employing a new Miller compensation scheme for two serially-connected amplifiers.

FIG. 5 shows a schematic block diagram of a circuit 500 employing the new Miller compensation scheme for two serially-connected amplifiers 510 and 520. In this new configuration, Miller compensation is achieved by (i) eliminating resistor Rs of FIG. 4 and (ii) using PMOS device PM0 of FIG. 5 as both (a) a current-mirror loading device for amplifier 510 and (b) the resistance for Miller compensation by connecting the output of the second amplifier 520 to the source of PM0 through a feedback path consisting of only a compensation capacitor Cmiller.

Embodiments of the invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, general-purpose computer, or other processor.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit having an amplifier having an input node and an output node, the amplifier comprising a control stage and a push-pull stage, wherein:
   the control stage is connected between the amplifier input node and the push-pull stage;
   the push-pull stage is connected between the control stage and the amplifier output node;
   the control stage comprises a programmable resistor network configurable to generate dc bias voltages for the push-pull stage, wherein the programmable resistor network comprises a plurality of parallel resistor legs, each resistor leg comprising a configurable switch and a resistor connected in series.

2. The integrated circuit of claim 1, wherein:
   the push-pull stage comprises a P-type device and an N-type device interconnected at the output node; and
   the programmable resistor network is connected to apply the dc bias voltages to gates of the P-type and N-type devices.

3. The integrated circuit of claim 1, wherein the programmable resistor network is connected between a constant-current source and a constant-current sink.

4. The integrated circuit of claim 1, further comprising a load connected between the output node and a ground.

5. An integrated circuit having an amplifier having an input node and an output node, the amplifier comprising a control stage and a push-pull stage, wherein:
   the control stage is connected between the amplifier input node and the push-pull stage;
   the push-pull stage is connected between the control stage and the amplifier output node;
   the control stage comprises a programmable resistor network configurable to generate dc bias voltages for the push-pull stage, and the programmable resistor network is programmable such that, when the input node is at zero volts, transistors in the push-pull stage are configured near cut-off such that quiescent current through the push-pull stage is low.

6. The integrated circuit of claim 1, wherein:
   the amplifier is configured as an output driver;
   the integrated circuit further comprises:
      an operational amplifier (op-amp), wherein the output driver is connected to the op-amp; and
      a compensation feedback path connected from the output of the output driver to the op-amp.

7. The integrated circuit of claim 6, wherein:
   the compensation feedback path comprises a compensation capacitor; and
   the compensation feedback path is connected to a transistor of an output of the op-amp such that the op-amp transistor functions as a resistance device for the compensation feedback path.

8. The integrated circuit of claim 7, wherein the op-amp transistor is a current-mirror loading device in the op-amp.

9. The integrated circuit of claim 1, wherein:
   the push-pull stage comprises a P-type device and an N-type device interconnected at the output node;
   the programmable resistor network is connected to apply the dc bias voltages to gates of the P-type and N-type devices;
   the programmable resistor network is connected between a constant-current source and a constant-current sink;
   the programmable resistor network comprises a plurality of parallel resistor legs, each resistor leg comprising a configurable switch and a resistor connected in series;
   further comprising a load connected between the output node and ground; and
   the programmable resistor network is programmable such that, when the input node is at zero volts, transistors in the push-pull stage are configured near cut-off such that quiescent current through the push-pull stage is low.

10. The integrated circuit of claim 4, wherein:
    the amplifier is configured as an output driver;
    the integrated circuit further comprises:
       an operational amplifier (op-amp), wherein the output driver is connected to the op-amp; and
       a compensation feedback path connected from the output of the output driver to the op-amp.

11. The integrated circuit of claim 10, wherein:
    the compensation feedback path comprises a compensation capacitor; and
    the compensation feedback path is connected to a transistor of an output of the op-amp such that the op-amp transistor functions as a resistance device for the compensation feedback path.

12. The integrated circuit of claim 11, wherein the op-amp transistor is a current-mirror loading device in the op-amp.

13. The integrated circuit of claim 12, wherein:
    the push-pull stage comprises a P-type device and an N-type device interconnected at the output node;
    the programmable resistor network is connected to apply the dc bias voltages to gates of the P-type and N-type devices;
    the programmable resistor network is connected between a constant-current source and a constant-current sink;
    the programmable resistor network comprises a plurality of parallel resistor legs, each resistor leg comprising a configurable switch and a resistor connected in series;

further comprising a load connected between the output node and ground; and the programmable resistor network is programmable such that, when the input node is at zero volts, transistors in the push-pull stage are configured near cut-off such that quiescent current through the push-pull stage is low.

14. The integrated circuit of claim 5, wherein:
the amplifier is configured as an output driver;
the integrated circuit further comprises:
- an operational amplifier (op-amp), wherein the output driver is connected to the op-amp; and
- a compensation feedback path connected from the output of the output driver to the op-amp.

15. The integrated circuit of claim 14, wherein:
the compensation feedback path comprises a compensation capacitor; and
the compensation feedback path is connected to a transistor of an output of the op-amp such that the op-amp transistor functions as a resistance device for the compensation feedback path.

16. The integrated circuit of claim 15, wherein the op-amp transistor is a current-mirror loading device in the op-amp.

\* \* \* \* \*